(12) United States Patent
Wu et al.

(10) Patent No.: US 8,865,586 B2
(45) Date of Patent: Oct. 21, 2014

(54) UBM FORMATION FOR INTEGRATED CIRCUITS

(75) Inventors: Yi-Wen Wu, Xizhi (TW); Zheng-Yi Lim, Hsin-Chu (TW); Ming-Che Ho, Tainan (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 21 days.

(21) Appl. No.: 13/344,446

(22) Filed: Jan. 5, 2012

(65) Prior Publication Data

US 2013/0175685 A1    Jul. 11, 2013

(51) Int. Cl.
| | |
|---|---|
| H01L 21/44 | (2006.01) |
| H01L 21/4763 | (2006.01) |
| H01L 23/48 | (2006.01) |
| H01L 23/52 | (2006.01) |
| H01L 23/495 | (2006.01) |
| H01L 23/485 | (2006.01) |
| H01L 21/768 | (2006.01) |

(52) U.S. Cl.
CPC ............. H01L 23/485 (2013.01); *H01L 21/768* (2013.01)
USPC ............ 438/613; 438/632; 438/652; 438/618; 438/121; 438/760; 257/738; 257/E21.585; 257/E23.021; 257/673; 257/737

(58) Field of Classification Search
CPC ......... H01L 21/00; H01L 23/00; H01L 24/00; H01L 23/485; H01L 23/482; H01L 23/48; H01L 23/3192; H01L 21/768; H01L 21/44; H01L 21/476371; H01L 21/70; H01L 24/11; H01L 24/05; H01L 24/03; H01L 24/13; H01L 2224/05027; H01L 2224/05008; H01L 2224/05022; H01L 2224/05155; H01L 2224/05164; H01L 2224/05541; H01L 2224/05548; H01L 2224/05571; H01L 2224/05572; H01L 2224/05583; H01L 2224/0401; H01L 2224/13022; H01L 2224/13023; H01L 2224/13027; H01L 2224/13099; H01L 2224/131; H01L 2924/01078; H01L 2924/00012; H01L 2924/00014; H01L 2924/207; H01L 2924/131; H01L 2924/014
USPC .......... 257/738, E21.585, 673, 737, E23.021, 257/E23.023, E23.033, E23.068, E23.069, 257/E21.508, E21.503; 438/613, 632, 438/652.618, FOR. 343, 98, 121, 453.523, 438/533, 622, 680, 681, 428, 436, 438, 646, 438/696, 760

See application file for complete search history.

(56) References Cited

U.S. PATENT DOCUMENTS

| | | | |
|---|---|---|---|
| 2008/0136019 A1* | 6/2008 | Johnson et al. | 257/737 |
| 2008/0308934 A1* | 12/2008 | Alvarado et al. | 257/738 |
| 2009/0111217 A1* | 4/2009 | Chung et al. | 438/109 |
| 2009/0283905 A1* | 11/2009 | Huang et al. | 257/737 |
| 2011/0049706 A1 | 3/2011 | Huang et al. | |

FOREIGN PATENT DOCUMENTS

| | | |
|---|---|---|
| KR | 20020094472 | 12/2002 |
| KR | 1020110114155 | 10/2011 |

* cited by examiner

Primary Examiner — Julio J Maldonado
Assistant Examiner — Moazzam Hossain
(74) Attorney, Agent, or Firm — Slater & Matsil, L.L.P.

(57) ABSTRACT

A method includes forming a polymer layer over a metal pad, forming an opening in the polymer layer to expose a portion of the metal pad, and forming an under-bump-metallurgy (UBM). The UBM includes a portion extending into the opening to electrically couple to the metal pad.

20 Claims, 13 Drawing Sheets

UBM FORMATION FOR INTEGRATED CIRCUITS

BACKGROUND

In the formation of a semiconductor wafer, integrated circuit devices such as transistors are first formed at the surface of a semiconductor substrate. Interconnect structures are then formed over the integrated circuit devices. Connectors such as metal bumps are formed on the surface of the semiconductor chip, so that the integrated circuit devices can be accessed.

In a typical metal-bump formation process, an under-bump metallurgy (UBM) layer is first formed using sputtering to electrically couple to a metal pad. The UBM layer may include a titanium layer, and a copper seed layer over the titanium layer. Metal bumps are then formed on the UBM layer, for example, by plating. The formation process includes forming a mask to cover first portions of the UBM layer, and leave second portions of the UBM layer un-covered. The metal bumps are formed on the second portions of the UBM layer. After the formation of the metal bumps, the mask is removed, and the first portions of the UBM layer are removed by wet etching.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A method for forming under-bump-metallurgy (UBM) and an overlying electrical connector is provided in accordance with various embodiments. The intermediate stages of manufacturing the UBM and the electrical connector in accordance with the embodiments are illustrated. The variations of the embodiments are discussed. Throughout the various views and illustrative embodiments, like reference numbers are used to designate like elements.

Figure 1:
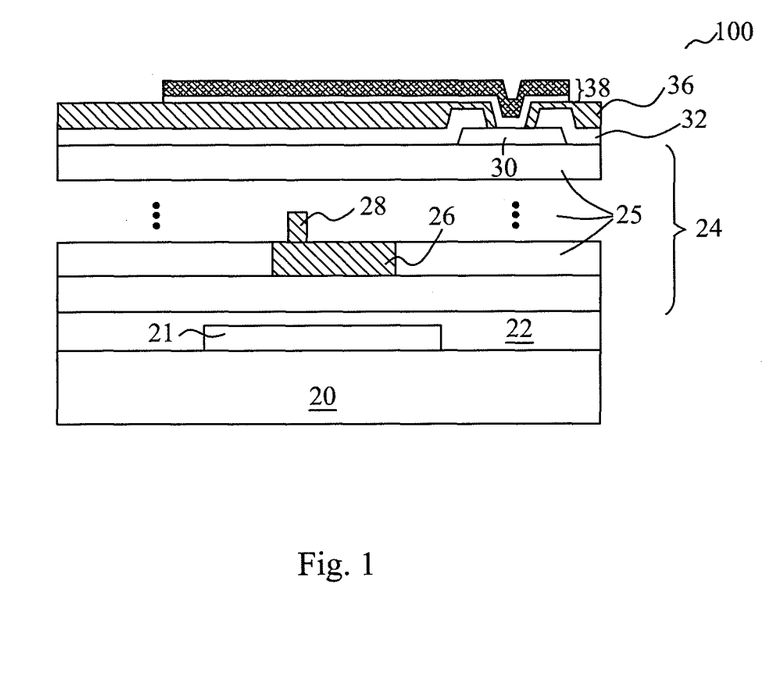
FIGS. 1 through 11 are cross-sectional views and top views of intermediate stages in the manufacturing of an under-bump-metallurgy (UBM) and a connector in accordance with various embodiments.

Referring to FIG. 1, wafer 100, which includes semiconductor substrate 20, is provided. Semiconductor substrate 20 may be a bulk silicon substrate or a silicon-on-insulator substrate, while other semiconductor materials including group III, group IV, and group V elements may also be used. Integrated circuit devices such as transistors (schematically illustrated as 21) are formed at a surface of semiconductor substrate 20. Wafer 100 may further include inter-layer dielectric (ILD) 22 over semiconductor substrate 20, and metal layers 24 over ILD 22. Metal lines 26 and vias 28 are formed in dielectric layers 25. The combination of metal lines at a same level is referred to a metal layer hereinafter. Accordingly, a plurality of metal layers 24 are interconnected through vias 28. In an embodiment, dielectric layers 25 are formed of low-k dielectric materials. The dielectric constants (k values) of the low-k dielectric materials may be less than about 3.0, or less than about 2.5, for example. Metal lines 26 and vias 28 may be formed of copper or copper alloys, although they can also be formed of other metals. One skilled in the art will realize the formation details of the metal layers.

Metal pad 30 is formed over metal layers 24, and may by electrically coupled to metal lines 26 and vias 28. Metal pad 30 may be an aluminum pad or an aluminum-copper pad, and hence is alternatively referred to as aluminum pad 30 hereinafter, although other metallic materials may be used. Passivation layer 32 is formed over metal layers 24. Portions of passivation layer 32 may cover the edge portions of aluminum pads 30. A portion of aluminum pad 30 is exposed through an opening in passivation layer 32. Passivation layer 32 may be a single layer or a composite layer, and may be formed of a non-porous material. In an embodiment, passivation layer 32 is a composite layer comprising a silicon oxide layer (not shown), and a silicon nitride layer (not shown) over the silicon oxide layer. Passivation layer 32 may also be formed of other non-porous dielectric materials such as un-doped silicate glass (USG), silicon oxynitride, and/or the like.

Polymer layer 36 is formed over passivation layer 32. Polymer layer 36 may comprise a polymer such as an epoxy, polyimide, benzocyclobutene (BCB), polybenzoxazole (PBO), and the like. The formation methods may include spin coating, for example. Polymer layer 36 is patterned to form an opening, through which aluminum pad 30 is exposed. The patterning of polymer layer 36 may be performed using photo lithography techniques. Polymer layer 36 may be dispensed in a liquid form, and then cured. Alternatively, polymer layer 36 may be a laminate film laminated on passivation layer 32.

Post-passivation interconnect (PPI) 38 is formed to electrically connect to aluminum pad 30 through an opening in polymer layer 36. PPI 38 is such named since the formation of PPI 38 is after the formation of passivation layer 32. PPI 38 may be formed of pure copper, substantially pure copper, or a copper alloy. PPI 38 may further include a nickel-containing layer. The formation methods include electro plating, electro-less plating, sputtering, chemical vapor deposition methods, and the like.

Figure 2:
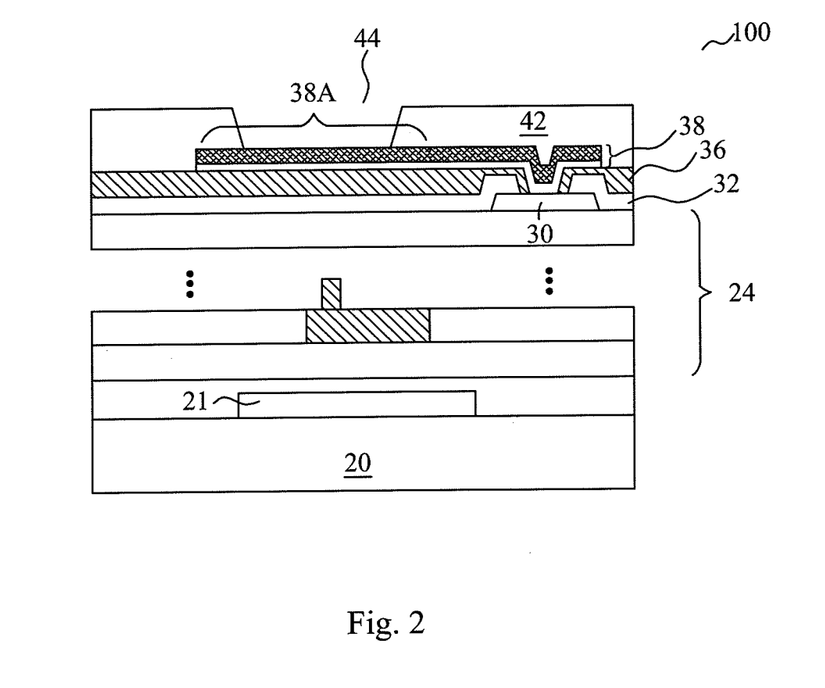

FIG. 2 illustrates the formation and patterning of polymer layer 42. Polymer layer 42 may comprise polyimide or other polymer based materials such as PBO, BCB, an epoxy, and the like. In an embodiment, polymer layer 42 is formed of spin coating, or formed of a laminate film, which is laminated on PPI 38 and polymer layer 36. After the patterning of polymer layer 42, a portion of PPI 38, which is referred to as PPI pad 38A hereinafter, is exposed through opening 44.

Figure 3A:
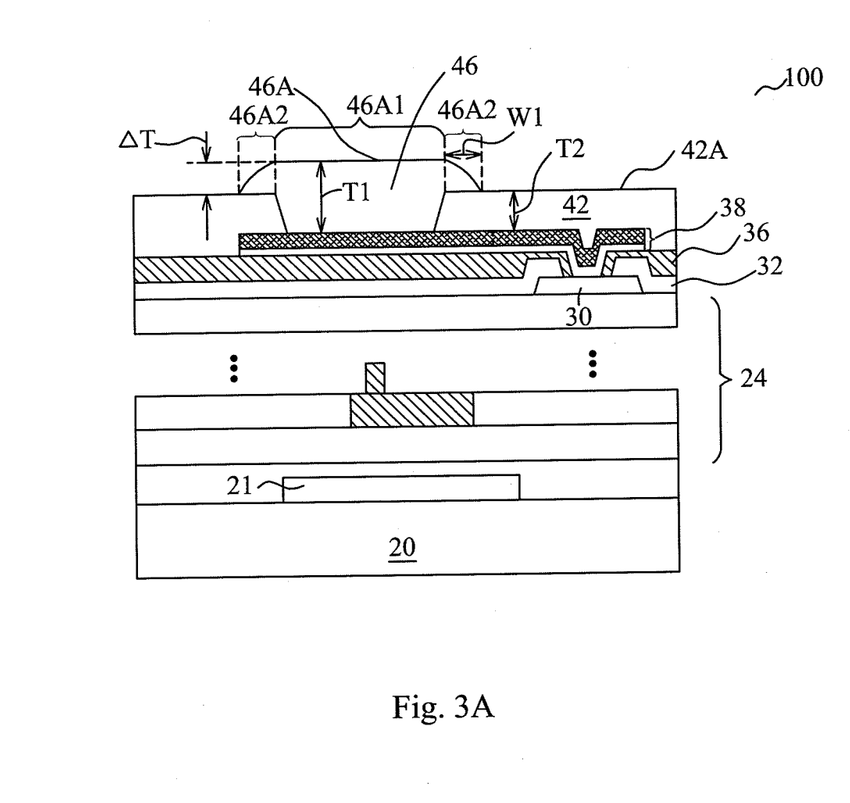

Referring to FIG. 3A, a chemical plating step is performed to form under-bump-metallurgy (UBM) 46. UBM 46 may have a single-layer structure or a composite structure including a plurality of sub-layers formed of different materials, and may comprise a layer(s) selected from the group consisting essentially of a nickel layer, a palladium layer, a gold layer, and combinations thereof. The chemical plating may include electro-less (E-less) plating, immersion plating, and/or the like. In an embodiment, UBM 46 is formed of electro-less nickel electro-less palladium immersion gold (ENEPIG), which includes a nickel layer, a palladium layer on the nickel layer, and a gold layer on the palladium layer. The gold layer may be formed using immersion plating. In other embodiments, UBM 46 may be formed of other materials and methods, including, but not limited to, electro-less nickel immersion gold (ENIG), electro-less nickel electro-less palladium (ENEP), direct immersion gold (DIG), or the like.

Figure 3B:
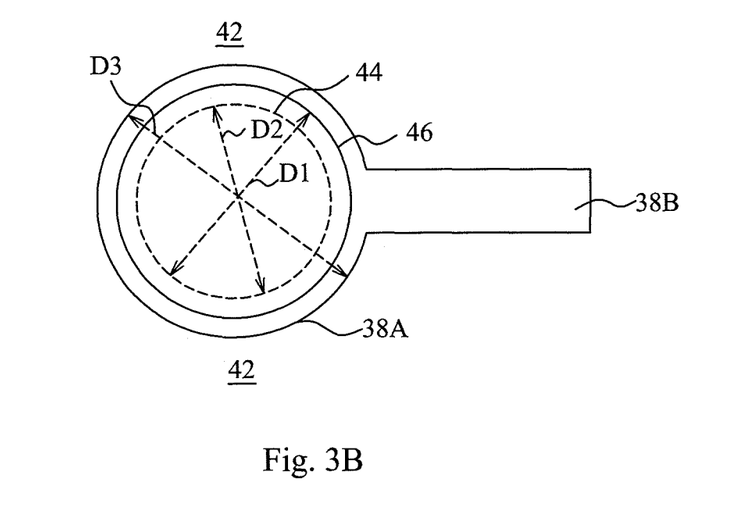

FIG. 3B schematically illustrates a top view of PPI 38 and UBM 46 as in FIG. 3A. PPI 38 includes PPI pad 38A and PPI line 38B connected to PPI pad 38A. The top-view size (such as dimension D1) of UBM 46 is greater than the top-view size (such as dimension D2) of opening 44 (also refer to FIG. 2) in polymer layer 42. The top-view size (such as dimension D3) of PPI pad 38A may be equal to, greater than, or smaller than top-view size D1 of UBM 46.

Referring back to FIG. 3A, thickness T1 of UBM 46 is greater than thickness T2 of polymer layer 42. Since electro-less plating is isotropic, the growth of UBM 46, when in opening 44 (FIG. 2), is upwardly with substantially no horizontal growth, until the top surface of UBM 46 is level with top surface 42A of polymer layer 42. Above this level, since there is no polymer layer 42 limiting the horizontal growth of UBM 46, UBM 46, when extending upwardly, also grows laterally, and the upward growth rate may be substantially close to the lateral growth rate. As a result, portions of UBM 46 are grown to overlap portions of polymer layer 42. The overlapped portions have width W1, which may be between about 0.5 μm and about 10 μm, for example. It is realized, however, that the dimensions recited throughout the description are merely examples, and may be changed to different values. Top surface 46A of UBM 46 is higher than top surface 42A of polymer layer 42, where height difference ΔT between top surface 46A and top surface 42A may also be between about 0.6 μm and about 13 μm. Top surface 46A includes a first portion (an inner portion) 46A1 that overlaps the portion of metal pad 38A that is exposed through polymer layer 42 and does not overlap polymer layer 42, and a second portion (an outer portion) 46A2 overlapping polymer layer 42. The second portion 46A2 encircles first portion 46A1. First portion 46A1 of top surface 46A may be a substantially flat top surface, which is not lower than second portion 46A2 of top surface 46A, and may be higher than second portion 46A2. Second portion 46A2 may be a non-flat surface. Furthermore, second portion 46A2 may be divided into inner portions and outer portions, with the inner portions closer to first portion 46A1 than the outer portions. It is observed that from inner portions to outer portions, the height gradually reduces.

Figure 4:
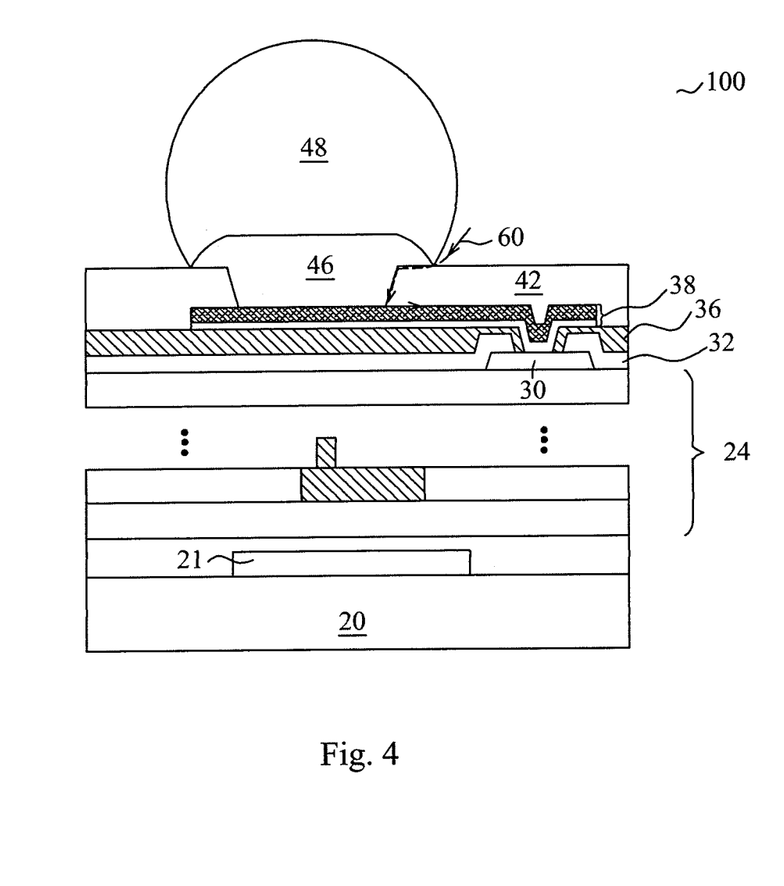

Referring to FIG. 4, connector 48 is formed. In an embodiment, connector 48 is a solder ball, which is placed on UBM 46. The structure shown in FIG. 4 may then go through a reflow process, and solder ball 48 is reflowed. In alternative embodiments, connector 48 may comprise a metal pillar, which may be a copper pillar. Additional layers such as a nickel layer, a solder cap, a palladium layer, and the like, may also be formed on the metal pillar.

Figure 5:
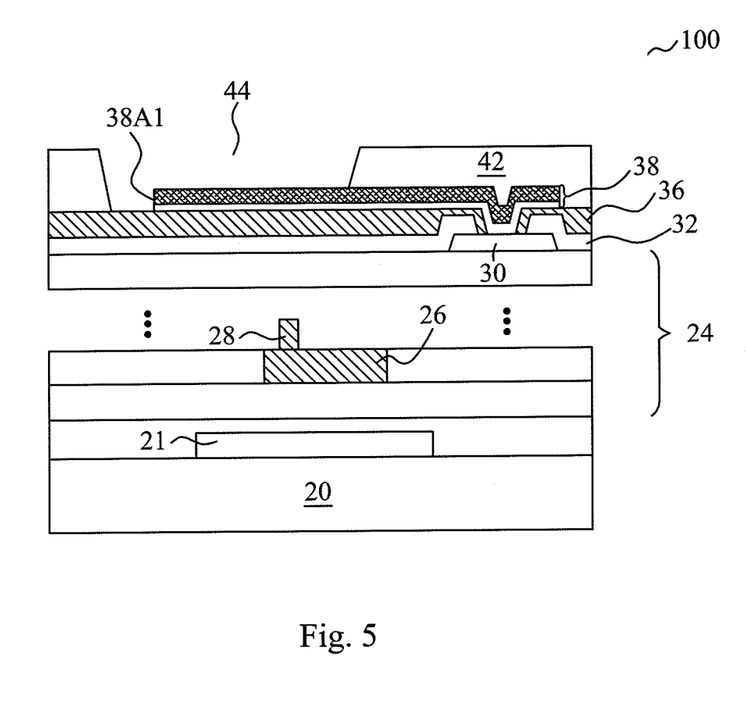
Figure 6A:
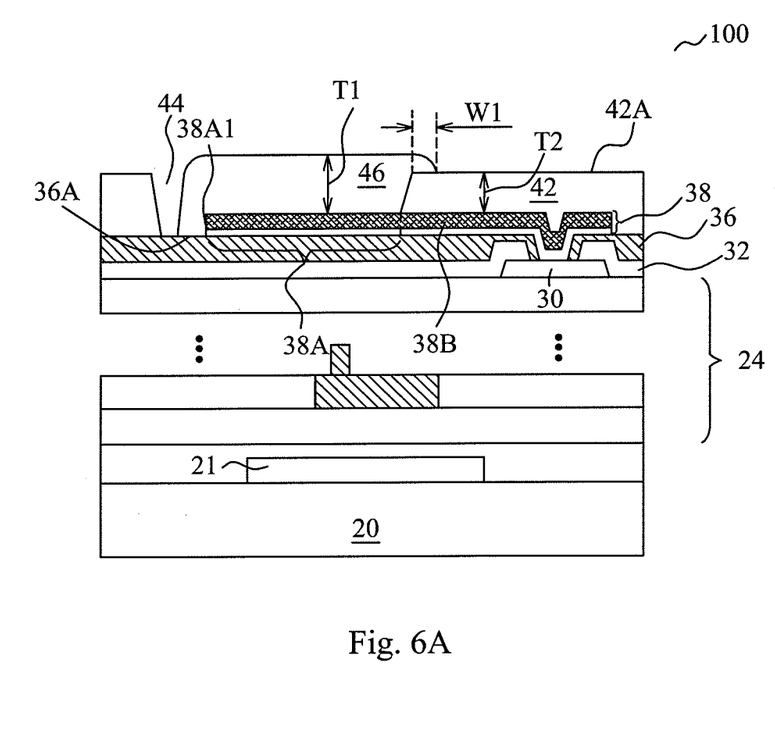
Figure 6B:
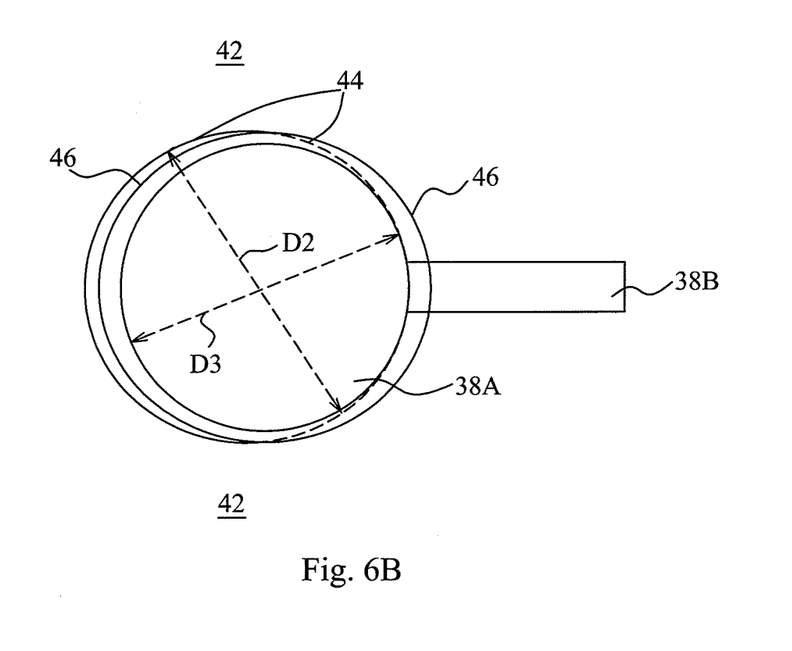
Figure 7:
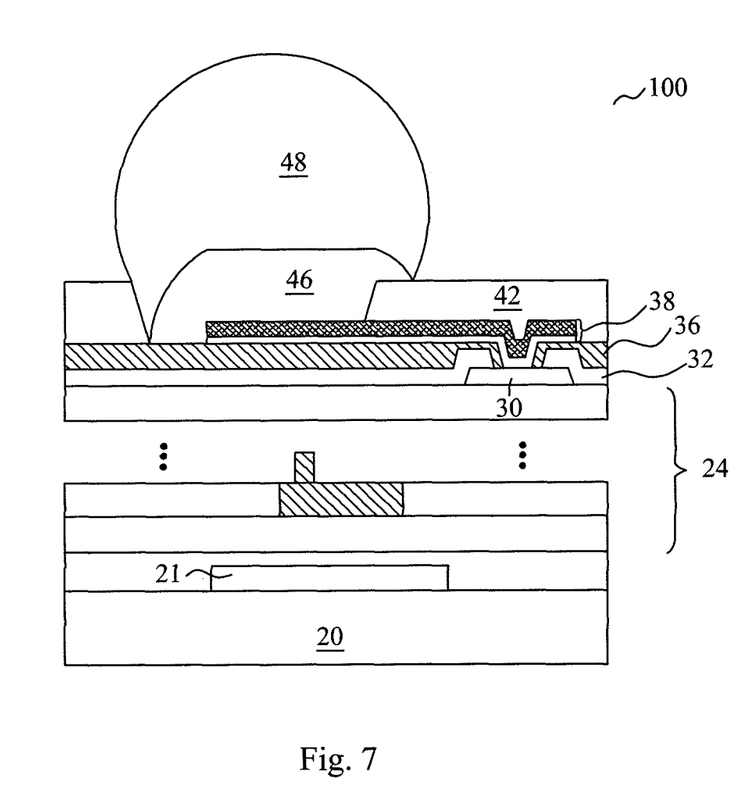

FIGS. 5 through 7 illustrate cross-sectional views of intermediate stages in the formation of a UBM and a connector in accordance with alternative embodiments. Unless specified otherwise, the materials and formation methods of the components in these embodiments are essentially the same as the like components, which are denoted by like reference numerals in the embodiments shown in FIGS. 1 through 4. The formation details of the embodiments shown in FIGS. 5 through 7 may thus be found in the discussion of the embodiments shown in FIGS. 1 through 4.

The initial steps of these embodiments are essentially the same as shown in FIG. 1. Next, as shown in FIG. 5, polymer layer 42 is formed and patterned. The resulting opening 44 has a size greater than the size of the exposed portion of PPI pad 38A (please also refer to FIG. 6B). Edge 38A1 of PPI pad 38A may be exposed to opening 44. The layer underlying polymer layer 42, such as polymer layer 36, may also have a portion exposed through opening 44.

Referring to FIG. 6A, UBM 46 is formed, wherein the material of UBM 46 may be selected from the same available materials as in the embodiment shown in FIGS. 1 through 4. Furthermore, the formation method of UBM 46 may be selected from the same available methods as in the embodiment shown in FIGS. 1 through 4, and may comprise electro-less plating. Thickness T1 of the resulting UBM 46 is greater than thickness T2 of polymer layer 42. Accordingly, top surface 46A of UBM 46 has a center portion higher than top surface 42A of polymer layer 42. Furthermore, on one side of opening 44 (the right side in FIG. 6A), a portion of UBM 46 is over and vertically overlaps polymer layer 42. On the other side, UBM 46 is formed horizontally and vertically starting from edge 38A1 of PPI pad 38A. UBM 46 may also comprise a portion in physical contact with the top surface 36A of polymer layer 36, which portion also is also level with PPI 38. In this embodiment, since UBM 46 may grow horizontally start from the beginning of the UBM plating process, the lateral size of UBM 46 may be increased.

FIG. 6B schematically illustrates a top view of PPI 38 and UBM 46 as in FIG. 6A. PPI 38 includes PPI pad 38A and PPI line 38B connected to PPI pad 38A. The exposed portion of the top-view size (such as dimension D3) of PPI pad 38A may be smaller than the top-view size (such as dimension D2) of opening 44 (also refer to FIG. 2) in polymer layer 42. FIG. 7 illustrates the formation of connector 48, which may fill the remaining space of opening 44 (FIGS. 5 and 6) not filled by UBM 46.

The structures shown in FIGS. 4 and 7 may be used in the formation of wafer-level chip-scale packages (WLCSP). FIGS. 8 through 11 illustrate the cross-sectional view of intermediate stages in the formation of a connector and an UBM in accordance with alternative embodiments. These embodiments are similar to the embodiments shown in FIGS. 1 through 7, except that no PPI is formed, and UBM 46 is formed directly over a metal pad.

Figure 8:
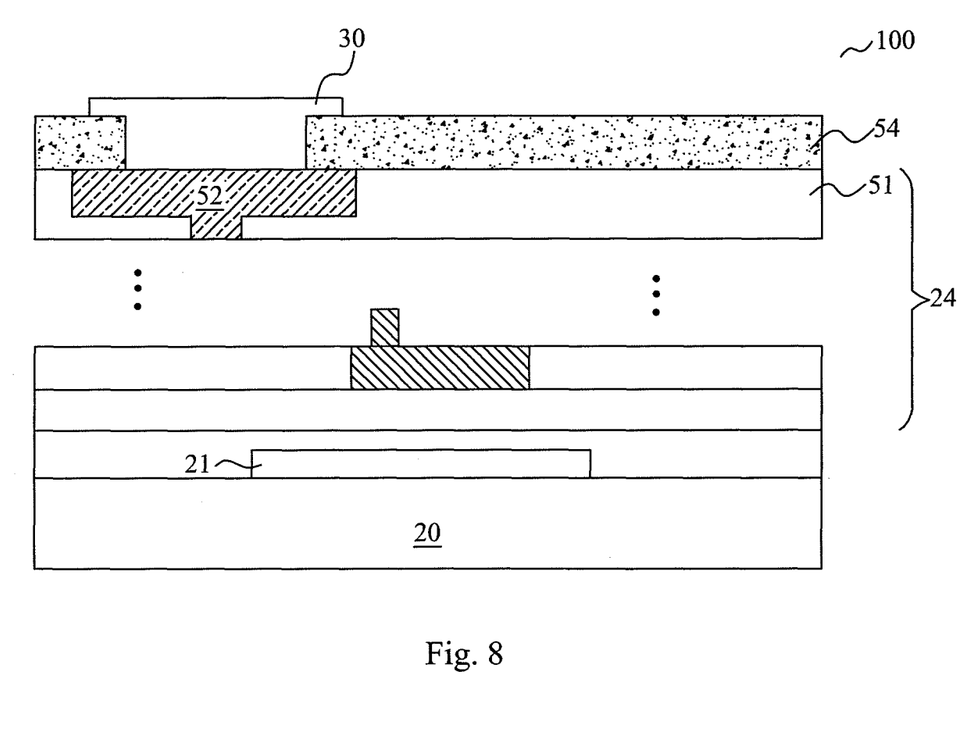

Referring to FIG. 8, metal pad 30 is formed. Metal pad may be an aluminum copper pad or a copper pad, although other conductive materials may be used. Before the formation of metal pad 30, passivation layer 54 may be formed over top metal 52, which top metal may be in the top metallization layer, and may be formed in low-k dielectric layer 51. Top metal 52 may be formed of copper or a copper alloy, and may be formed using a damascene process. An opening (occupied by metal pad 30) is formed in passivation layer 54, followed by the formation of metal pad 30. In an embodiment, edge portions of metal pad 30 may be over and overlapping portions of passivation layer 54. Passivation layer 54 is also referred to as passivation-1.

Figure 9:
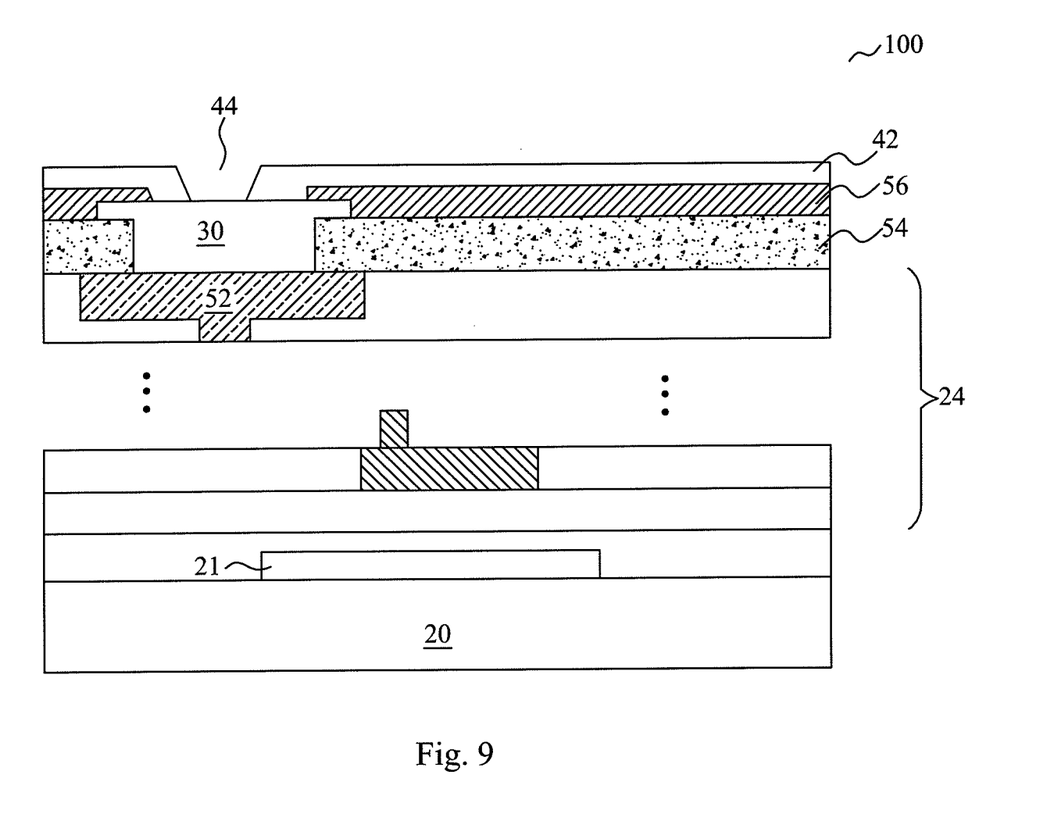

Next, as shown in FIG. 9, passivation layer 56 (alternatively referred to as passivation-2) and polymer layer 42 are formed. Each of passivation layers 54 and 56 may be formed of a composite layer including a silicon oxide layer and a silicon nitride layer over the silicon oxide layer, a USG layer, a silicon oxynitride layer, or the like. Opening 44 is formed in polymer layer 42, wherein portions of polymer layer 42 cover edge portions of metal pad 30.

Figure 10:
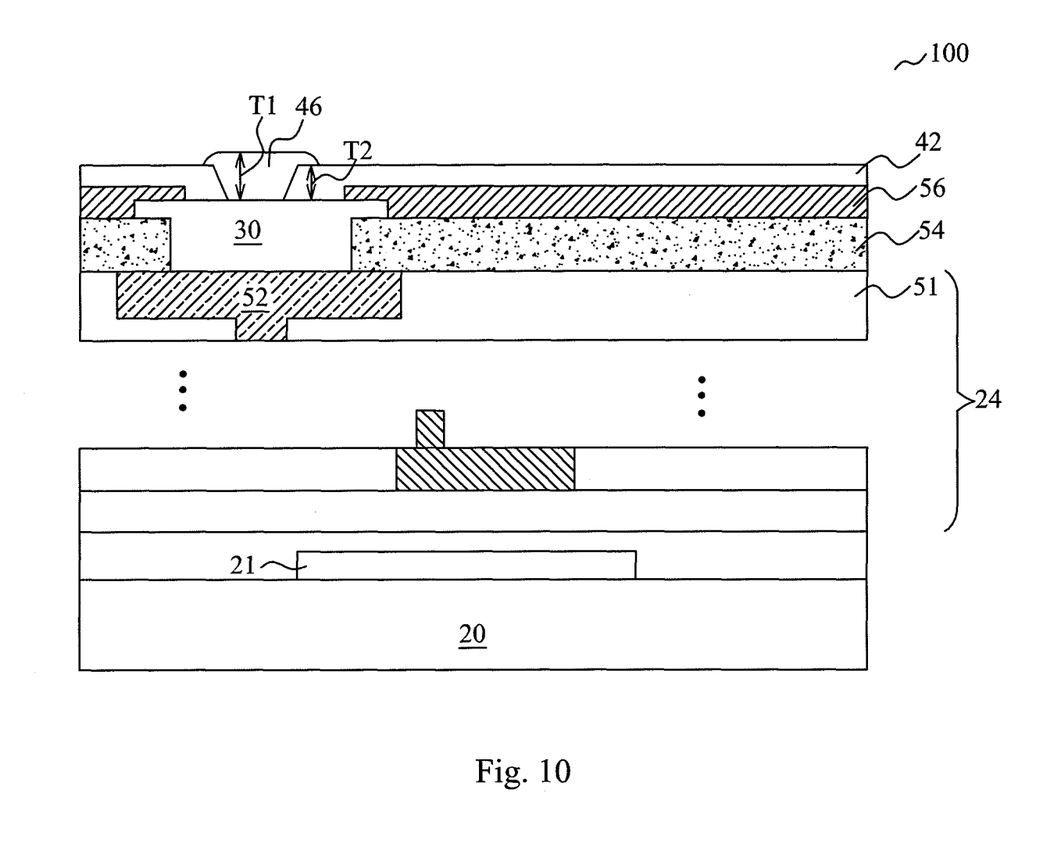
Figure 11:
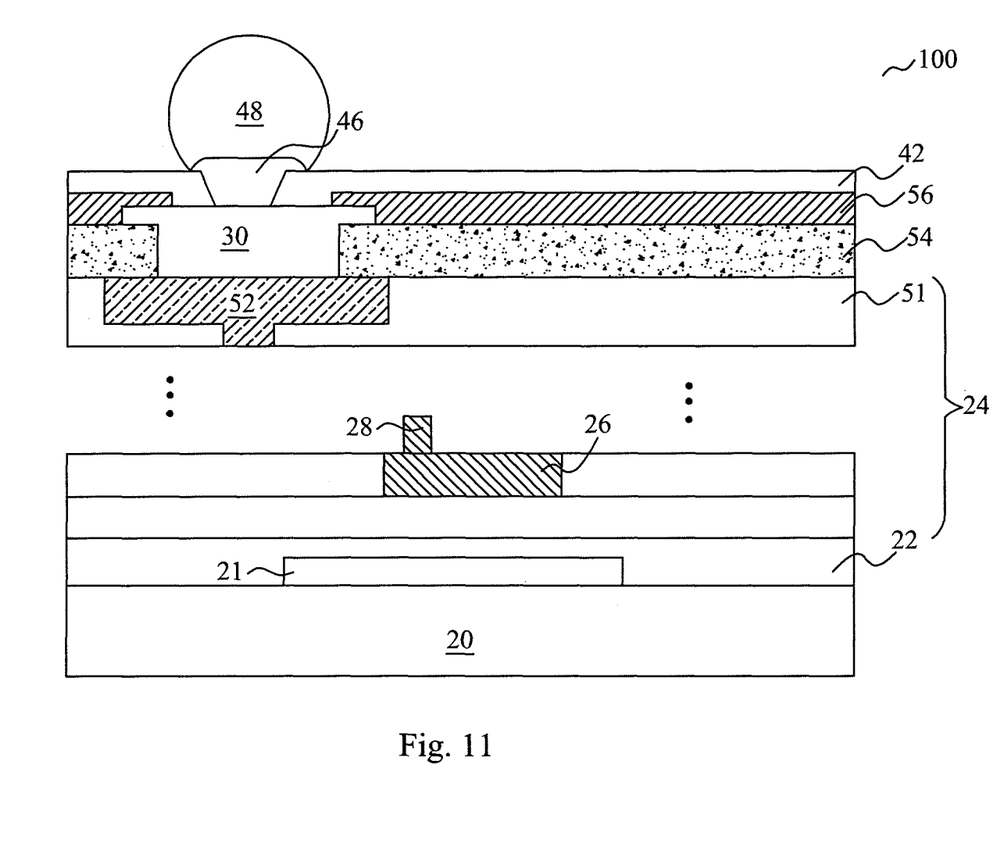

Next, referring to FIG. 10, UBM 46 is formed. Thickness T1 of UBM 46 is greater than thickness T2 of polymer layer 42. Furthermore, UBM 46 expands laterally to beyond the edge of opening 44, and overlaps portions of polymer layer 42. Similarly, UBM 46 is also formed using electro-less plating. The materials, formation methods, and the respective dimensions regarding UBM 46 may be referred to in the embodiments shown in FIGS. 1 *through* 4, and are not discussed herein. In FIG. 11, connector 48, which may be a solder ball or another type of connector, is formed.

In the embodiments, by using electro-less plating to form UBMs, the manufacturing process is simplified, and the manufacturing cost is reduced. Furthermore, making the thickness of UBM 46 (FIGS. 4, 7, and 11) greater than the thickness of the top polymer layer may increase the traveling path of any moisture for reaching PPI 38 or metal pad 30, which traveling path (shown as arrow 60 in FIG. 4) includes the interface between UBM 46 and polymer layer 42. Accordingly, better moisture prevention is achieved.

In accordance with embodiments, a method includes forming a polymer layer over a metal pad, forming an opening in the polymer layer to expose a portion of the metal pad, and forming a UBM using electro-less plating. The UBM includes a portion extending into the opening to electrically couple to the metal pad.

In accordance with other embodiments, a method includes forming a first passivation layer, and forming a metal pad, wherein at least a portion of the metal pad is disposed in the first passivation layer. A polymer layer is formed over the metal pad. An opening is formed in the polymer layer to expose a portion of the metal pad. A UBM is formed on an exposed surface of the metal pad using chemical plating, until a top surface of the UBM is higher than a top surface of the polymer layer.

In accordance with yet other embodiments, a device includes a passivation layer, a metal pad with at least a portion disposed in the passivation layer, a polymer layer over the metal pad, an opening in the polymer layer, and a UBM extending into the opening and electrically coupled to the metal pad. A top surface of the UBM includes a first portion and a second portion. The first portion overlaps the portion of the metal pad and does not overlap the polymer layer. The second portion overlaps a portion of the polymer layer. The first portion is not lower than the second portion.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a post passivation interconnect (PPI) comprising a PPI pad over a dielectric layer;
    forming a polymer layer over the PPI pad;
    forming an opening in the polymer layer to expose a portion of the PPI pad, wherein a top surface of the PPI pad, an edge of the PPI pad, and a top surface of the dielectric layer are exposed through the opening in the polymer layer;
    forming an under-bump-metallurgy (UBM) using chemical plating, wherein the UBM comprises a first portion extending into the opening to contact the top surface and the edge of the PPI pad, and a second portion over and contacting the top surface of the polymer layer;
    forming a metal conductive layer over the UBM; and
    performing a thermal step after the forming the metal conductive layer.

2. The method of claim 1, wherein the step of forming the UBM is performed until the UBM has a thickness greater than a thickness of the polymer layer.

3. The method of claim 1, wherein an entirety of the top surface of the polymer layer that is exposed through the opening is covered by the UBM.

4. The method of claim 1, wherein after the forming the UBM, the UBM fully seals the opening.

5. The method of claim 1, wherein the step of forming the UBM comprises electro-less plating.

6. The method of claim 1, wherein the step of forming the UBM comprises immersion plating.

7. The method of claim 1, wherein the PPI pad is over a passivation layer.

8. The method of claim 1, wherein a portion of the top surface of the polymer layer is exposed through the opening, and wherein the exposed portion is partially covered by the UBM.

9. The method of claim 8, wherein the exposed portion of the top surface of the polymer layer comprises an additional portion not covered by the UBM.

10. The method of claim 1, wherein an entirety of the exposed portion of the top surface of the polymer layer is covered by the UBM, with the opening fully sealed by the UBM.

11. The method of claim 1, wherein the UBM comprises a first edge and a second edge on opposite sides of the UBM, wherein the first edge extends into the opening in the polymer layer, and the second edge overlaps the polymer layer.

12. The method of claim 11, wherein the first edge does not overlap any portion of the polymer layer.

13. A method comprising:
    forming a post passivation interconnect (PPI) comprising a PPI pad over a dielectric layer;
    forming a polymer layer over the PPI;
    forming an opening in the polymer layer to expose a portion of the PPI pad, wherein a top surface of the PPI pad, an edge of the PPI pad, and a top surface of the dielectric layer are exposed through the opening in the polymer layer; and
    forming an under-bump-metallurgy (UBM), wherein the UBM comprises a first portion extending into the opening to contact the top surface and the edge of the PPI pad, and a second portion covering a first part of the exposed top surface of the dielectric layer that is exposed through the opening in the polymer layer, wherein a second part of the exposed top surface of the dielectric layer is not covered by the UBM.

14. The method of claim 13 further comprising:
    forming a solder region over the UBM; and
    reflowing the solder region.

15. The method of claim 13, wherein the second portion of the UBM is contacts the top surface of the polymer layer.

16. The method of claim 13, wherein the UBM comprises a first edge and a second edge opposite to each other, wherein the first edge extends into the opening in the polymer layer, and the second edge overlaps the polymer layer.

17. The method of claim 16, wherein the first edge does not overlap any portion of the polymer.

18. A method comprising:

forming a post passivation interconnect (PPI) comprising a PPI pad over a dielectric layer;

forming a polymer layer over the PPI;

forming an opening in the polymer layer to expose a portion of the PPI pad, wherein a top surface of the PPI pad, an edge of the PPI pad, and a top surface of the dielectric layer are exposed through the opening in the polymer layer; and forming an under-bump-metallurgy (UBM), wherein the UBM comprises a first edge and a second edge opposite to each other, and wherein the first edge extends into the opening in the polymer layer, and the second edge overlaps the polymer layer.

19. The method of claim 18, wherein the first edge does not overlap any portion of the polymer.

20. The method of claim 18, wherein the UBM comprises a first portion extending into the opening to contact the top surface and the edge of the PPI pad, and a second portion covering an entirety of the exposed top surface of the dielectric layer that is exposed through the opening in the polymer layer.

* * * * *